United States Patent
Yieh et al.

(10) Patent No.: US 9,379,021 B2
(45) Date of Patent: Jun. 28, 2016

(54) METHOD TO REDUCE K VALUE OF DIELECTRIC LAYER FOR ADVANCED FINFET FORMATION

(71) Applicant: Applied Materials, Inc., Santa Clara, CA (US)

(72) Inventors: Ellie Y. Yieh, San Jose, CA (US); Ludovic Godet, Sunnyvale, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 2 days.

(21) Appl. No.: 14/505,167

(22) Filed: Oct. 2, 2014

(65) Prior Publication Data

US 2015/0099360 A1    Apr. 9, 2015

Related U.S. Application Data

(60) Provisional application No. 61/909,551, filed on Nov. 27, 2013, provisional application No. 61/886,445, filed on Oct. 3, 2013.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/302* | (2006.01) |
| *H01L 21/461* | (2006.01) |
| *H01L 21/8234* | (2006.01) |
| *H01L 29/66* | (2006.01) |
| *H01L 21/28* | (2006.01) |
| *H01L 21/04* | (2006.01) |
| *H01L 21/225* | (2006.01) |
| *H01L 21/3115* | (2006.01) |
| *H01L 21/223* | (2006.01) |

(52) U.S. Cl.
CPC ...... *H01L 21/823462* (2013.01); *H01L 21/046* (2013.01); *H01L 21/0415* (2013.01); *H01L 21/2236* (2013.01); *H01L 21/2253* (2013.01); *H01L 21/28185* (2013.01); *H01L 21/31155* (2013.01); *H01L 21/823431* (2013.01); *H01L 29/6681* (2013.01); *H01L 29/66803* (2013.01)

(58) Field of Classification Search
None
See application file for complete search history.

(56) References Cited

U.S. PATENT DOCUMENTS

| | | | |
|---|---|---|---|
| 6,583,070 B1 * | 6/2003 | Tsui | H01L 23/5222 257/E23.144 |
| 6,593,181 B2 | 7/2003 | Laibowitz et al. | |

(Continued)

FOREIGN PATENT DOCUMENTS

JP    2001217416 A    8/2001

OTHER PUBLICATIONS

International Search Report and Written Opinion for International Application No. PCT/US2014/066652 dated Feb. 25, 2015.

*Primary Examiner* — Stephanie Duclair
(74) *Attorney, Agent, or Firm* — Patterson & Sheridan, LLP

(57) ABSTRACT

Embodiments described herein generally relate to methods for forming gate structures. Various processes may be performed on a gate dielectric material to reduce the K value of the dielectric material. The gate dielectric having a reduced K value may provide for reduced parasitic capacitance and an overall reduced capacitance. The gate dielectric may be modified without thermodynamic constraint.

19 Claims, 5 Drawing Sheets

(56) References Cited

U.S. PATENT DOCUMENTS

| | | |
|---|---|---|
| 6,720,213 B1 | 4/2004 | Gambino et al. |
| 7,018,902 B2 * | 3/2006 | Visokay et al. ............... 438/287 |
| 7,183,183 B2 | 2/2007 | Duerksen et al. |
| 8,084,311 B1 * | 12/2011 | Horak ............... H01L 21/76897 438/183 |
| 2005/0012201 A1 | 1/2005 | Duerksen et al. |
| 2006/0237801 A1 | 10/2006 | Kavalieros et al. |
| 2009/0087974 A1 * | 4/2009 | Waite et al. ................... 438/592 |
| 2011/0117679 A1 * | 5/2011 | Lee ................... H01L 29/41791 438/5 |
| 2011/0127588 A1 * | 6/2011 | Cheng et al. ................... 257/288 |
| 2011/0230030 A1 * | 9/2011 | de Souza et al. ............. 438/303 |
| 2011/0269278 A1 | 11/2011 | Hoentschel et al. |
| 2012/0126342 A1 | 5/2012 | Cheng et al. |
| 2013/0183817 A1 | 7/2013 | Mikalo et al. |

* cited by examiner

FIG. 3B"

METHOD TO REDUCE K VALUE OF DIELECTRIC LAYER FOR ADVANCED FINFET FORMATION

CROSS-REFERENCE TO RELATED APPLICATIONS

This application claims benefit of U.S. provisional patent application No. 61/886,445, filed Oct. 3, 2013, and U.S. provisional patent application No. 61/909,551, filed Nov. 27, 2013, both of which are herein incorporated by reference in their entirety.

BACKGROUND

1. Field

Embodiments described herein generally relate to methods of forming a gate in a semiconductor device. More specifically, embodiments described herein relate to methods for reducing the K value of a dielectric layer useful in advanced FinFET formation.

2. Description of the Related Art

In response to an increased need for smaller electronic devices with denser circuits, devices with three dimensional (3D) structures have been developed. An example of such devices may include FinFETs having conductive fin-like structures that are raised vertically above a horizontally extending substrate. Conventional FinFETs may be formed on a substrate, such as a semiconducting substrate or silicon-on-insulator. The substrate may comprise a semiconducting substrate and an oxide layer disposed on the semiconducting substrate.

In light of the continued demand for continually smaller devices, a decreased gate pitch increases the parasitic capacitance for both contact-to-gate and epi-to-gate, thus, increasing the overall gate capacitance. Minimizing the traditional capacitance elements, such as under-lap capacitance, channel capacitance, junction capacitance and inner and outer fringe capacitance is becoming more challenging. Further, gate and contact critical dimensions have been scaling at a slower rate than gate pitch. As a result, parasitic fringe capacitance (contact-to-gate capacitance and epi-to-gate capacitance) is becoming an increasingly significant issue.

Therefore, there is a need in the art for methods for reducing parasitic capacitance in FinFET structures.

SUMMARY

In one embodiment, a method of forming a gate is provided. The method comprises transferring a substrate having a 3D structure comprising a gate dielectric structure disposed adjacent to a dummy gate structure into a plasma processing apparatus. A vertically oriented portion of the gate dielectric structure may be exposed to ions in the apparatus. One or more ion bombardment angles may be selected in response to an aspect ratio of the 3D structure.

In another embodiment, a method of forming a gate is provided. The method comprises transferring a substrate having a 3D structure comprising a gate dielectric structure disposed adjacent to a dummy gate structure into a plasma processing apparatus. A barrier layer may be formed over the gate dielectric structure. The barrier layer may be exposed to ions in the apparatus along one or more ion bombardment angles which may be selected in response to an aspect ratio of the 3D structure.

In yet another embodiment, a method of forming a gate is provided. The method comprises transferring a substrate having a 3D structure comprising a gate dielectric disposed over one or more fin structures into a plasma processing apparatus. The gate dielectric may be exposed to ions in the apparatus and one or more ion bombardment angles may be selected in response to an aspect ratio of the fin structures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to methods for forming gate structures and more specifically, to forming gate dielectric layers having a reduced K value. Gate dielectric materials may be formed by exposing as deposited dielectric layers to energetic ions to form a low dielectric constant material Film properties of the gate dielectric may be altered by ion bombardment to reduce the K value. Ion bombardment of the gate dielectric may modify the gate dielectric composition and/or structure without exceeding a thermal budget of the materials being processed. Gate dielectrics having a low K value may provide for reduced parasitic capacitance.

An improved gate and gate dielectric is especially advantageous to 3D FinFET structures as will be described in greater detail below. Processes that may be performed to reduce the K value of a gate dielectric material may include light ion implantation of species such as He, H or Ne, direct ion implantation of carbon and/or boron based ions, deposition and knock on of a carbon and/or boron film and deposition, knock on and ion implantation, performed in parallel, of carbon and/or boron ions. The processes described above benefit from an angular bombardment of the ions at various stages of FinFET formation. For example, the processes may be performed after the gate dielectric has been deposited, after the gate dielectric has been etched and after a dummy gate removal process. Various FinFET formation processes may employ the aforementioned processes during various stages of FinFET formation to provide a gate dielectric having a reduced K value that maintains the integrity of the gate dielectric at reduced critical dimensions.

Figure 1:
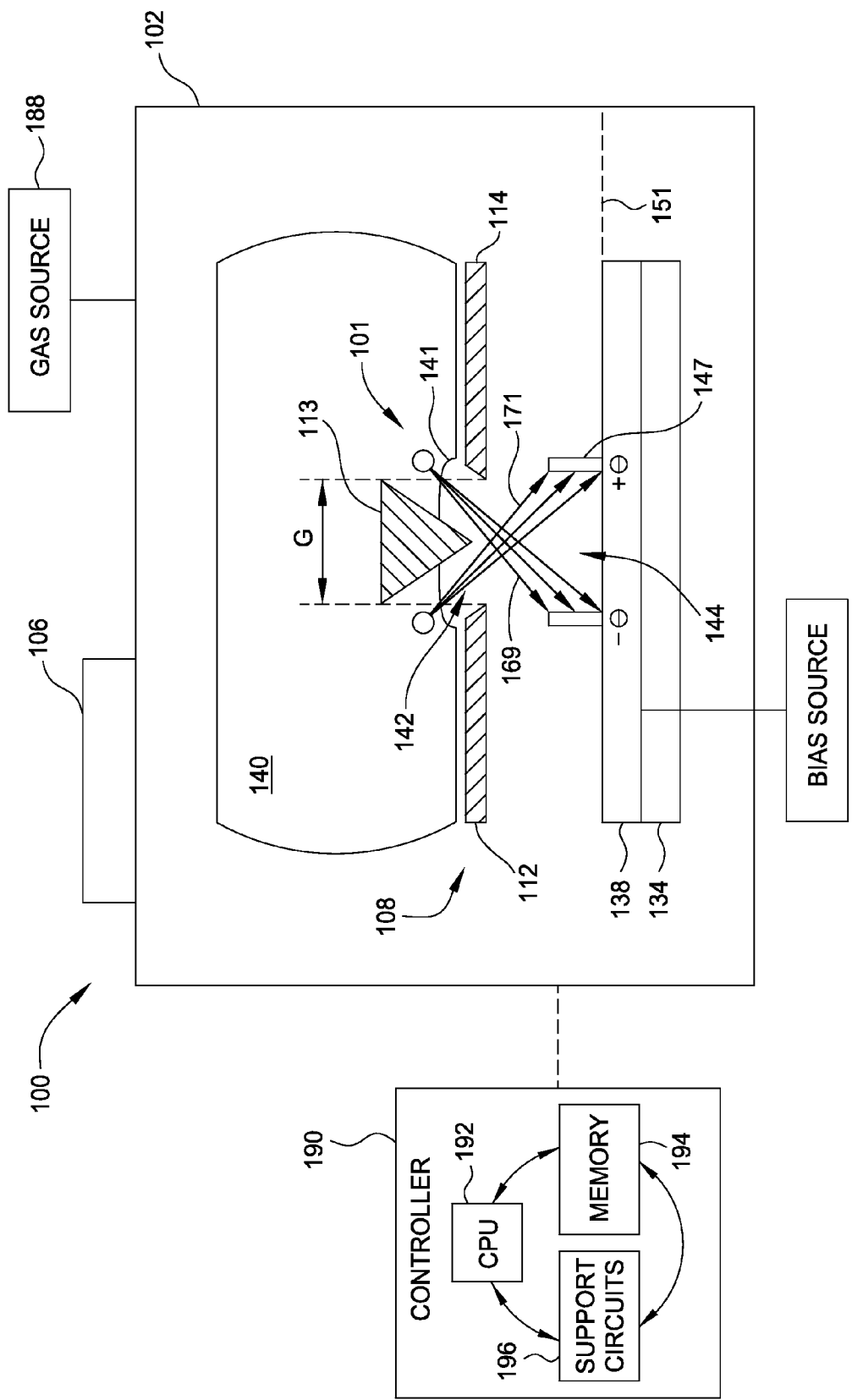
FIG. 1 illustrates a schematic diagram of a plasma processing apparatus useful to perform embodiments disclosed herein.

FIG. 1 illustrates a schematic diagram of a plasma processing apparatus 100 useful to perform processes disclosed herein. In addition to the apparatus 100 described below, more traditional ion implantation apparatuses, such as beamline ion implantation apparatus, may be used to perform the methods described herein. One example of a beamline ion implantation apparatus is the Varian VIISta® Trident, available from Applied Materials, Inc. Santa Clara, Calif. The plasma processing apparatus 100 includes a process chamber 102, a platen 134, a source 106, and a modifying element 108. The platen 134 may be transferred into and positioned in the processing chamber 102 for supporting a substrate 138. The platen 134 may be coupled to an actuator (not shown) which may cause the platen 134 to move in a scanning motion. The scanning motion may be a back and forth movement within a single plane which may be substantially parallel to the modifying element 108. The source 106 is configured to generate the plasma 140 in the process chamber 102. The modifying element 108 includes a pair of insulators 112, 114 which may define a gap therebetween having a horizontal spacing (G). The insulators 112, 114 may comprise an insulating material, a semi-conducting material, or a conductive material. The modifying element also includes a directional element 113 disposed in a position relative to the insulators 112, 114 such that ions 101 are provided toward the substrate 138.

In operation, a gas source 188 may supply an ionizable gas to the process chamber 102. Examples of an ionizable gas may include $BF_3$, $BI_3$, $N_2$, Ar, $PH_3$, $AsH_3$, $B_2H_6$, $H_2$, Xe, Kr, Ne, He, $CH_4$, $CF_4$, $AsF_5$, $PF_3$ and $PF_5$, among others. More specifically, species of ions may include He+, $H_3$+, $H_2$+, H+, Ne+, F+, C+, $CF_x$+, $CH_x$+, $C_xH_y$, N+, B+, $BF_2$+, $B_2H_x$+, Xe+ and molecular carbon, boron, or boron carbide ions. The source 106 may generate the plasma 140 by exciting and ionizing the gas provided to the process chamber 102. The ions 101 are attracted from the plasma 140 across the plasma sheath 142. For example, a bias source 190 is configured to bias the substrate 138 to attract the ions 101 from the plasma 140 across the plasma sheath 142. The bias source 190 may be a DC power supply to provide a DC voltage bias signal or an RF power supply to provide an RF bias signal.

The modifying element 108 modifies the electric field within the plasma sheath 142 to control a shape of the boundary 141 between the plasma 140 and the plasma sheath 142. The modifying element 108 includes the insulators 112, 114 and directional element 113. The insulators 112, 114 and directional element 113 may be fabricated from materials such as quartz, alumina, boron nitride, glass, silicon nitride and other suitable materials. The boundary 141 between the plasma 140 and the plasma sheath 142 is dependent upon the placement of the directional element 113 relative to the insulators 112, 114 as the directional element 113 may alter the electric field within the plasma sheath 142.

Ions following a trajectory path 171 may strike the substrate 138 at about an angle of +θ normal to the plane 151. Ions following trajectory path 169 may strike the substrate 138 at an angle of about −θ normal to the plane 151. Accordingly, the range of incident angles normal to the plane 151 may be between about +1° and about +65° and between about −1° and about −65°, excluding 0°. For example, a first range of incident angles normal to the plane 150 may be between about +5° and about +65° and a second range of incident angles may be between about −5° and about −65°. In one embodiment, the first range of incident angles relative to the plane 151 may be between about −10° and about −20° and the second range of incident angles relative to the plane 151 may be between about +10° and about +20°. In addition, some ion trajectories, such as paths 169 and 171, may cross one another.

Depending on a number of factors including, but not limited to, the positioning of the directional element 113, horizontal spacing (G) between the insulators 112, 114, the vertical spacing (Z) of the insulators 112, 114 above the plane 151, the dielectric constant of the directional element 113 and the insulators 112, 114 and other plasma processing parameters, the range of incident angles (θ), in one embodiment, may be between about +89° and about 89°, exclusive of 0°.

The range of incident angles may be selected based upon an aspect ratio of a 3D feature on the substrate 138. For example, sidewalls 147 of a trench 144, having an exaggerated size for clarity of illustration, may be more uniformly treated by the ions 101 than with conventional plasma processing apparatuses and procedures. The aspect ratio, which may be defined as the relationship between a pitch between the sidewalls 147 and a height of the sidewalls 147 extending from the substrate 138, may determine the angles at which the ions 101 are provided to provide more uniform treatment on the sidewalls 147. The aspect ratio of the 3D structures may be provided by the controller 190 prior to performing the ion bombardment process. Alternatively, a sensor in the apparatus 100 may determine the aspect ratio of the 3D structures prior to performing the ion bombardment process. In either example, the ion bombardment angles may be selected in response to the aspect ratio of the 3D structure.

For example, a first range of incident angles normal to the plane 151 and adapted to impact the sidewalls 147 may be between about +60° and about +90° and a second range of incident angles may be between about −60° and about −90°. In one embodiment, the first range of incident angles normal to the plane 151 and adapted to impact the sidewalls 147 may be between about −70° and about −80° and the second range of incident angles normal to the plane 151 and adapted to impact the sidewalls 147 may be between about +70° and about +80°. In one embodiment, angles at which the ions 101 are provided may be selected to avoid contact with material below the sidewalls 147, for example, the substrate 138 in one embodiment, or an insulator in another embodiment.

The above-described apparatus 100 can be controlled by a processor based system controller such a controller 190. For example, the controller 190 may be configured to control flow of various precursor gases and purge gases from gas sources, such as the gas source 188, during different stages of a substrate process sequence. The controller 190 includes a programmable central processing unit (CPU) 192 that is operable with a memory 194 and a mass storage device, an input control unit, and a display unit (not shown), such as power supplies, clocks, cache, input/output (I/O) circuits, and the like, coupled to the various components of the apparatus 100 to facilitate control of the substrate processing. The controller 190 also includes hardware for monitoring substrate processing through sensors in the apparatus 100, including sensors monitoring the precursor and purge gas flow. Other sensors that measure system parameters such as substrate temperature and position, chamber atmosphere pressure and the like, may also provide information to the controller 190.

To facilitate control of the apparatus 100 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Deposition, etching, implantation, and other processes are generally stored in the memory 194, typically as a software routine. The software routine may also be stored and/or executed by a second CPU (not shown) that is remotely located from the hardware being controlled by the CPU 192.

The memory 194 is in the form of computer-readable storage media that contains instructions, that when executed by the CPU 192, facilitates the operation of the apparatus 100. The instructions in the memory 194 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein), Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2A:
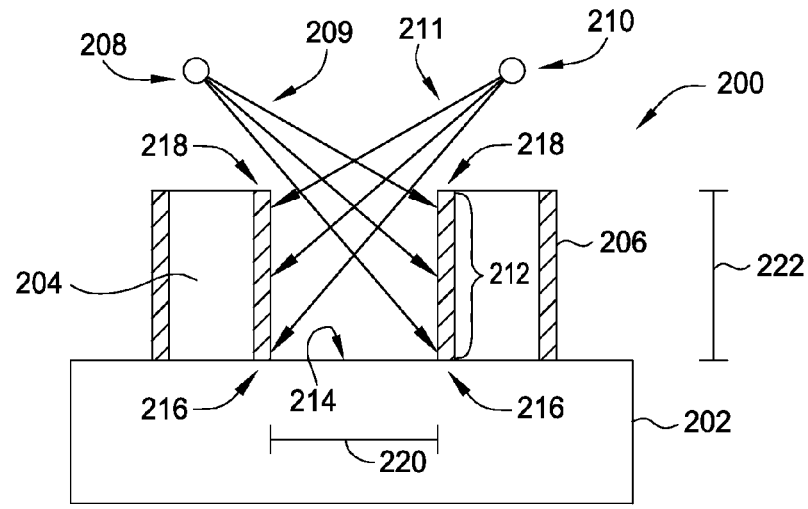
FIGS. 2A-2C are partial, cross-sectional views of a substrate illustrating a bi-directional angular ion bombardment process useful to perform embodiments disclosed herein.
Figure 2B:
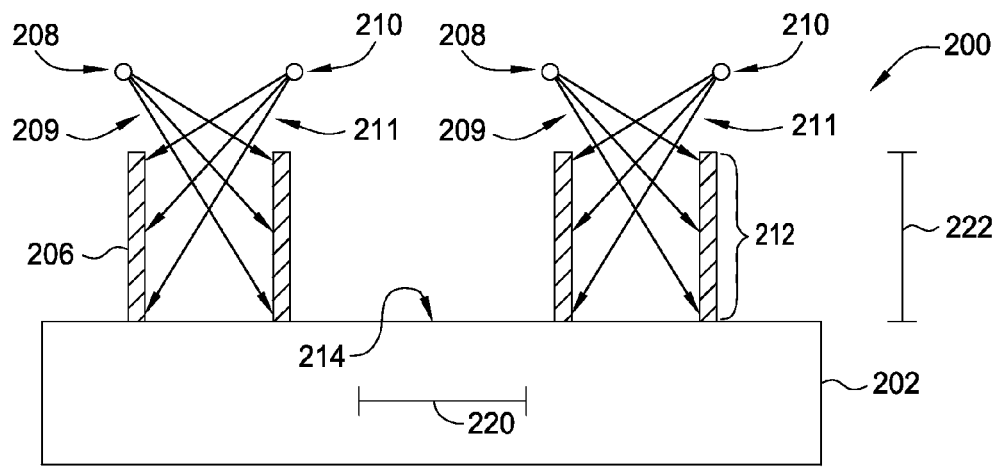
Figure 2C:
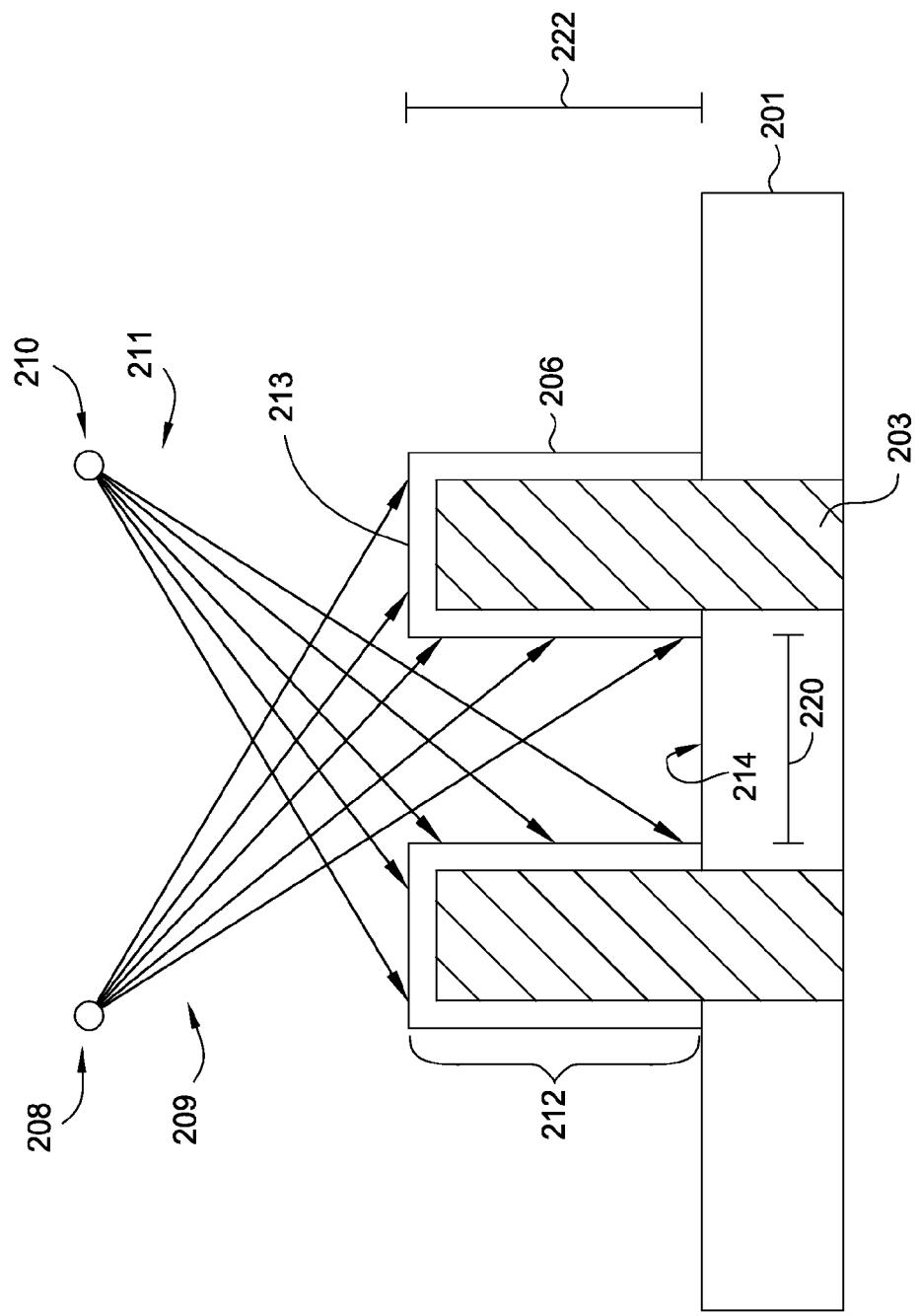

FIGS. 2A-2C illustrate cross-sectional views of a portion of a substrate illustrating bi-directional angular ion bombardment utilized by embodiments disclosed herein. FIG. 2A depicts a 3D feature 200 comprising a substrate 202 having a gate 204 formed thereon and a gate dielectric 206 layer formed over the gate 204. The gate 204 may be a dummy gate in certain embodiments. In other embodiments, the gate 204 may be representative of a fin structure having the gate dielectric 206 disposed thereon.

The bi-directional angular ion bombardment proceeds by directing ions toward the gate dielectric 206 from a first region 210. The ions may travel along one or more paths 211 selected to strike a vertical portion 212 of the gate dielectric 206 and avoid ion bombardment of a material 214 below the gate dielectric 206. Similarly, ions may be accelerated toward the gate dielectric 206 from a second region 208. The ions may travel along one or more paths 209 to strike the vertical portion 212 of the gate dielectric 206 and avoid bombardment of the material 214 below the gate dielectric 206.

In the bi-directional angular ion bombardment process, the angles or trajectories at which the ions are directed toward the substrate 202, are selected based upon an aspect ratio of the 3D features 200. The aspect ratio may be defined as the ratio of a pitch length 220 to a height 222 of the gate dielectric 206 extending above the substrate 202. As such, the ions traveling along paths 211, 209 may impact any point along the vertical portion 212 between a bottom region 216 and a top region 218 of the gate dielectric 206.

FIG. 2B schematically illustrates the structure FIG. 2A after the gate material 204, such as a dummy gate, has been removed. The surfaces of the gate dielectric 206 previously adjacent the gate material 204 are exposed. The bi-directional angular bombardment process may proceed on the exposed surfaces in a manner described above with regard to FIG. 2A.

FIG. 2C schematically Illustrates another embodiment of the bi-directional angular ion bombardment process. In this embodiment, fin structures 203 extend from the substrate 202 and an insulator material 201 disposed adjacent a lower portion of the fin structures 203. A gate dielectric is deposited over the fin structures 203 on the sidewalls 212 and the upper surface 213. Both the sidewalls 212 and the upper surface 213 are subjected to ion bombardment. As illustrated, bi-directional ion bombardment may impact the gate dielectric 206 along the entire sidewalls 212 and upper surface 213.

Figure 3A:
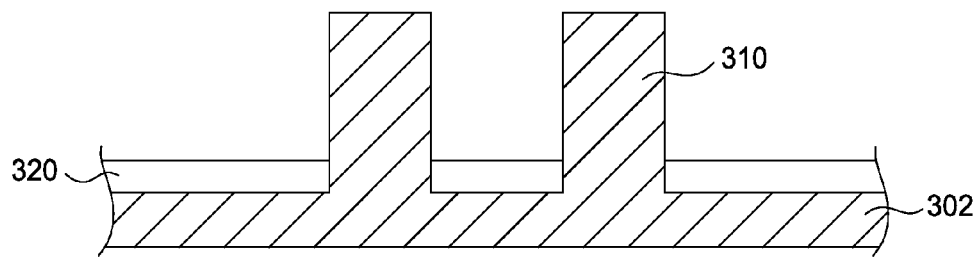
FIGS. 3A-3C are partial, cross-sectional views of a substrate illustrating a sequence of forming a 3D structure according to one embodiment disclosed herein.
Figure 3B:
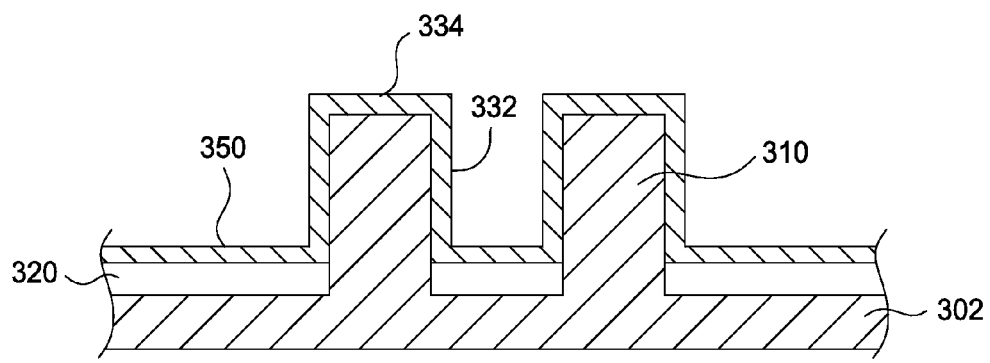
Figure 3B:
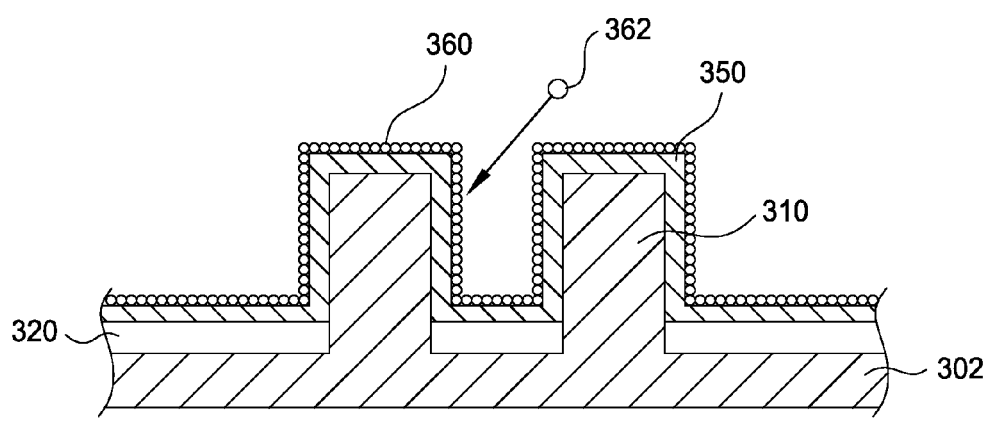
Figure 3C:
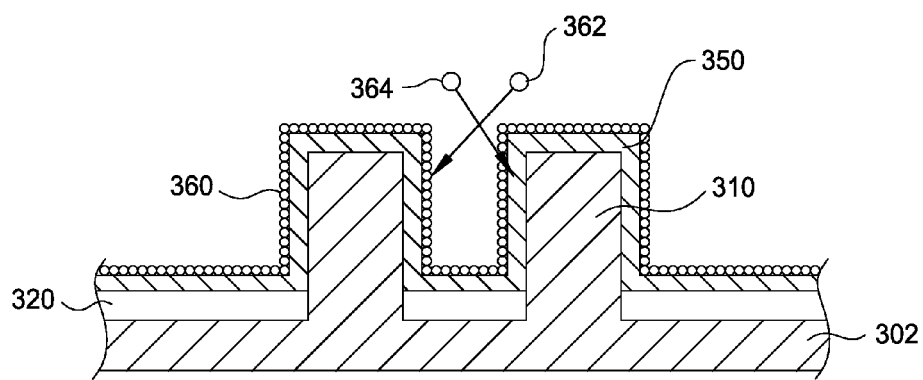
Figure 3C:
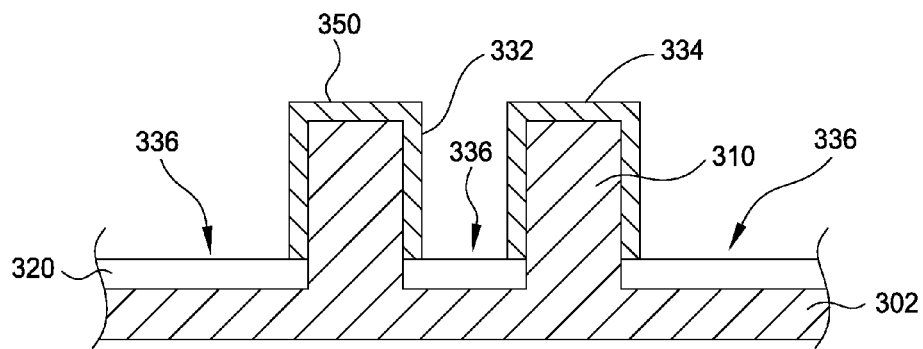

FIGS. 3A-3C depict a sequence of forming a 3D structure according to one embodiment described herein. A substrate 302 having fin structures 310 extending from the substrate 302 may be provided as illustrated in FIG. 3A. An insulator 320, such as $SiO_2$ or SiN, may be formed over the substrate 302 such that a portion of the fin structures 310 remain extended beyond the insulator 320.

Next, a gate dielectric layer 350 is formed over the insulator 320 and the fin structures 310 as illustrated in FIG. 3B. The gate dielectric layer 350 may act as a spacer between the fin structures 310 and a subsequently deposited gate. The gate dielectric layer 350 may be for example, $Al_2O_3$, SiN, BN, SiCN or $SiO_2$, or other dielectric material capable of being treated with processes disclosed herein to lower the K value while maintaining thickness integrity of the gate dielectric layer 350. The gate dielectric layer 350 may be conformally deposited over the insulating layer 320 and the fin structures 310 by suitable processes, such as CVD, ALD, PVD or the like. In one example, a silicon nitride layer may be deposited by CVD to form the gate dielectric layer 350. A silicon precursor, such as $SiH_4$, and a nitrogen precursor, such as $N_2$ or $NH_3$, may be energized into a plasma and deposited via a CVD process to form the gate dielectric layer 350.

After the gate dielectric layer 350 has been formed, one or more ion implantation processes to modify the K value of the gate dielectric layer 350 may be performed. In one embodiment, a light ion implantation process may be performed on the gate dielectric layer 350. In this embodiment, a light ion species, such as H, or a halogen ion, for example He, or Ne, may be implanted into the gate dielectric layer 350 to create a cavity inside the dielectric material. The implanted light ions may form bubbles or voids within the dielectric material which results in a lower K value of the dielectric material by altering the physical structure of the gate dielectric layer 350. A low temperature anneal may optionally be performed after the light ion implantation to diffuse the light ions from the gate dielectric layer 350. For example, an untreated SiN gate dielectric layer 350 may exhibit a K value of about 7.5. The gate dielectric material 350 after performing a light ion implantation process may exhibit a K value of about 5.1. Thus, the K value of the dielectric material may be lowered.

Various aspects of the light ion implantation process may be controlled to tune the K value. The size of the cavity formed within the gate dielectric layer 350 may be controlled by the ion energy and the ion flux/dose. In one example, He ion implantation may be provided in a dose of between about 1E15 (ions/cm$^2$) and about 1E19, such as about 2E17. As such, the He dose regime may maintain a pre-implantation thickness of the gate dielectric layer 350. The light ion species utilized may also reduce sputtering of the gate dielectric material 350 from the surface of the fin structures 310. The temperature at which the light ion implantation process is performed may also affect the resulting structure by diffusing ions implanted within the gate dielectric layer 350 out of the gate dielectric layer 350 to form the resulting void, which, in certain embodiments, may be empty of filled with He gas. The processing parameters, such as chamber pressure, gas flow rate and plasma source power, among others, may be selected to enhance the light ion implantation process.

In addition, the impact angle of the light ion species impacting the gate dielectric layer may be selected based upon an aspect ratio of features formed by the fin structures 310. Adjusting the bombardment angle may be selective for bombardment on sidewalls 332 of the gate dielectric material 350. As such, implantation on a region 354 below the gate dielectric material 350 may be avoided. However, the gate dielectric layer 350 disposed over a top region 334 of the fin structure may be bombarded with ions because the top region 334 bombardment is not determined by the aspect ratio dependent angular bombardment. The implant angle may be determined by the aspect ratio(s) of the features, which may be fin structures 310.

A bombardment angle having a substantially normal orientation (90°) to a surface of the gate dielectric layer 350 may implant the ions a greater depth than an implant angle having a substantially parallel orientation (0°). A continuum of implant angles, primarily determined by the aspect ratio of the features to avoid shadowing effects, between the normal and parallel extremes may be utilized to select a depth to which an ion is implanted. Also, the molecular weight of the ions selected for bombardment helps determine the implant depth. An ion having a smaller molecular weight may be implanted deeper than an ion having a greater molecular weight. For example, a hydrogen ion will penetrate the gate dielectric layer 350 deeper than a neon ion, assuming other implant variables are the same. The resulting implant depths of the light ions may be between about 1 nm and about 8 nm in various embodiments. The implant energy utilized to implant the ions also affects the depth of implantation. For example, a high implant energy will provide for deeper implantation.

After the light ion species have been implanted, a thermal annealing process may be performed at a temperature lower than about 400° C., such as about 350° C. to activate the void formation within the gate dielectric material.

In another embodiment, a direct ion implantation process of boron and/or carbon containing ions may be performed after the gate dielectric material 350 is deposited. In this embodiment, various boron and carbon containing precursors may be ionized and boron and/or carbon ions may be implanted into the dielectric material layer 350. In one example, only boron ions may be implanted and in another example, only carbon ions may be implanted. In certain embodiments, both boron and carbon containing ions may be implanted.

Similar to the light ion implantation process, the bi-directional angular ion bombardment process may be dictated by the aspect ratio of the features. The processing parameters with which the direct ion implantation process is performed may be selected to enhance direct ion implantation. In one example, the ion precursor is provided at a rate of about 25 sccm, energized with an RF power of about 1500 W, the precursor is provided in a dose of about 5E16 ions/cm$^2$, and the process is performed at a temperature of about 350° C. The direct ion implantation process, which may optionally be performed at an elevated temperature, will materially alter the composition of the gate dielectric layer 350 by changing the chemical makeup of the material. For example, the boron and/or carbon ions may function to dope the gate dielectric layer 350 and create a dielectric material having a reduced K value. After the boron and/or carbon ions have been implanted in the gate dielectric layer 350, a thermal annealing process similar to the annealing process described with regard to the light ion implantation process may also be performed.

In another embodiment, a deposition and knock on process may be performed after the gate dielectric material 350 is deposited as illustrated in FIG. 3B'. The term "knock on" may be defined as a recoil ion implant where an ion is implanted through surface layers formed on a gate dielectric to drive a dopant into the gate dielectric. The deposition and knock on process may begin by depositing a thin barrier layer 360 over the gate dielectric layer 350. The barrier layer 360 may comprise boron and/or carbon atoms deposited on the surface of the gate dielectric layer 350. The barrier layer 360 may function to provide additional protection to the fin structures 310 during subsequent ion implantation and as the source for implanted ions. During or after the barrier layer 360 formation, knock on ions 362 may bombard the barrier layer 360 and push boron and/or carbon ions present in the barrier layer 360 into the gate dielectric layer 350.

The knock on ions 362 may be the same ions as the ions used to form the barrier layer 360. As such, boron and/or carbon ions may be utilized for both the barrier layer 360 and as the knock on ions 362. Utilizing the deposition and knock on process may also advantageously benefit from a multiplier effect. The multiplier effect results when a single knock on ion 362 impacts the barrier layer 360 but results in multiple atoms being implanted into the gate dielectric layer 350. For example, the barrier layer 360 is deposited and knock on ions 362 are provided to bombard the barrier layer. The bombardment ions then drive ions present in the barrier layer 360 into the gate dielectric layer 350. Due to the bombardment process, multiple ions may be implanted when a single knock on ion 362 contacts the barrier layer. The multiplier effect may function to efficiently reduce the K value of the gate dielectric layer 350 and reduce the amount of ions required to bombard the barrier layer 360.

Similar to the direct ion implantation process described above, boron ions, carbon ions and boron and carbon ions in combination may be implanted into the gate dielectric layer 350 via the deposition and knock on process. The implantation process may be tuned to provide desired results by utilizing the bi-directional angular ion implantation process. For example, 2 nm of the barrier layer 360 is deposited utilizing a $CH_4/H_2$ or $B_2H_6/CH_4/H_2$ mixture with about a 3 kV bias and about a +−20° angular bi-directional ion implantation in a dose of about 2E16 cm$^2$. The bi-directional angular ion implantation process may be dependent upon an aspect ratio of the features within which the ions are being implanted. After the boron and/or carbon ions have been implanted in the gate dielectric layer 350, a thermal annealing process similar to the annealing process described with regard to the direct ion implantation process may also be performed.

In yet another embodiment, an ion assisted deposition and doping (IADD) process may be performed after the gate dielectric layer 350 is deposited as illustrated in FIG. 3B". The term IADD may refer to a process of depositing a film/barrier layer over surfaces of a material. The process may involve directing ions to the material over a range of angles to alter the physical or chemical structure of the underlying material. In the IADD process, deposition of the barrier layer 360, knock on of the barrier layer, and direct on implantation may be performed at the same time in parallel.

Here, the deposition process may utilize suitable boron and/or carbon precursors to form the barrier layer 360 containing boron and/or carbon atoms. The knock on ions 362 may be boron and/or carbon ions; however, they may also be ions other than boron and/or carbon. For example, the knock on on 362 may be arsenic. Other incident ions 364, such as hydrogen, boron and carbon ions may also be provided with the knock on ions 362. In this example, arsenic ions may sputter the barrier layer 360 and implant within the barrier layer 360. The knock on ions 362 may knock in atoms (boron and/or carbon) of the barrier layer 360 into the gate dielectric layer 350. The deposition and knock on processes may benefit from the multiplier effect as described above. While the deposition and knock on process is proceeding, the incident ions 364 may also be directly implanted into the gate dielectric layer 350.

Utilizing the IADD process may retain the on dose enhancement within the materials (gate dielectric layer 350) being processed. For example, an IADD process utilizing AsH$_3$ as the knock on on source and H$_2$ as the incident on source provided for an as retained dose of between about 5.0E14 (at/cm$^2$) and about 1.5E15 for deposition depths ranging from about 1.0 nm and about 8.0 nm. In this example, the retained dose may saturate the barrier layer 360 as the barrier layer 360 is sputtered away. The knock on ion deposition thickness (amount) may also be a variable in controlling the dose saturation.

The IADD process may also be tuned to provide desired results by utilizing the bi-directional angular ion implantation process. The bi-directional angular ion implantation process may be dependent upon an aspect ratio of the features within which the ions are being implanted. Both the knock on ions 362 and incident ions 364 for direct implantation may be provided at a range of angles relative to the surface of the substrate 302, After the knock on ions 362 and incident ions 364 have been implanted in the gate dielectric layer 350, a thermal annealing process similar to the annealing processes described above may also be performed.

Referring now to FIG. 3C, a portion of the gate dielectric layer 350 may be removed. For example, the horizontally oriented regions 336 of the gate dielectric layer 350 may remain unmasked and exposed to a wet or dry etching process. The etching process will remove the gate dielectric layer 350 from the horizontally oriented regions 336. FIG. 3O illustrates the resulting substrate 302 having the gate dielectric layer 350 formed over the fin structures 310.

In certain embodiments, the light ion implantation process, direct ion implantation process, deposition and knock on process and IADD processes described above with regard to FIGS. 3B' and 3B" may be performed after the gate dielectric layer 350 has been etched instead of directly after the gate dielectric layer 350 deposition as illustrated in FIG. 2O. A gate material (not shown) may subsequently be deposited over the substrate for form a completed FinFET structure.

The methods described herein may be automated by, for example, tangibly embodying a program of instruction upon a computer readable storage media capable of being read by a machine capable of executing the instructions. A general purpose computer is one example of such a machine. A non-limiting list of appropriate storage media well known in the art includes such devices as a readable or writeable CD, flash memory chips, various magnetic storage media and the like.

In sum, various ion implantation processes, such as light ion implantation, direct ion implantation, deposition and knock on and IADD may be performed at various stages of 3D structure formation, according to various embodiments. The ion implantation processes may benefit from utilizing the bi-directional angular implantation to more precisely tune certain aspects of the ion implantation processes. All of the processes described herein may be performed at room temperature or at an elevated temperature. Certain processes may be performed at both room temperature and elevated temperatures depending upon desired implantation characteristics. The ion implantation processes may advantageously lower the K value of gate dielectric material while maintaining the integrity of the gate dielectric without increasing the thickness of the gate dielectric material. The resulting gate dielectric material may reduce overall gate height while minimizing parasitic capacitances which may provide an improved microelectronic device.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a gate, comprising:
transferring a substrate having a 3D structure comprising a gate dielectric structure disposed adjacent to a dummy gate structure into a plasma processing apparatus;
removing the dummy gate structure; and
exposing a vertically oriented portion of the gate dielectric structure to ions with the plasma processing apparatus, wherein one or more ion bombardment angles are selected in response to an aspect ratio of the 3D structure, and wherein the ions create at least one void within the gate dielectric structure.

2. The method of claim 1, wherein the gate dielectric structure comprises a material selected from the group consisting of boron nitride, silicon nitride, silicon carbon nitride, and silicon dioxide and the dummy gate structure comprises a silicon material.

3. The method of claim 1, wherein the ions exposed to the vertically oriented portion of the gate dielectric structure are selected from the group consisting of He+, H3+, H2+, H+, Ne+, F+, CF$_x$+, CH$_x$+, CH$_x$+, B+, BF2+B$_x$H$_y$+, Xe+, C$_x$H$_y$+, molecular carbon, boron and boron carbide.

4. The method of claim 1, wherein the ions create at least one cavity within the gate dielectric structure.

5. The method of claim 1, wherein a first bombardment angle is between about +10° and about +20° and wherein a second bombardment angle is between about −10° and about −20°.

6. The method of claim 1 further comprising:
exposing the gate dielectric structure to ions in the apparatus at a temperature less than about 400° C.

7. The method of claim 1 further comprising:
etching the gate dielectric structure prior to the exposing the gate dielectric structure to ions.

8. The method of claim 1 wherein
the dummy gate structure is removed prior to exposing the gate dielectric structure to ions.

9. A method of forming a gate, comprising:
transferring a substrate having a 3D structure comprising a gate dielectric structure disposed adjacent to a dummy gate structure into a plasma processing apparatus;
removing the dummy gate structure;
forming a barrier layer over the gate dielectric structure; and
exposing the barrier layer to ions in the apparatus, wherein one or more ion bombardment angles are selected in response to an aspect ratio of the 3D structure.

10. The method of claim 9, wherein the barrier layer comprises at least one or boron and carbon.

11. The method of claim 9, wherein the ions comprise at least one of boron, carbon, and arsenic.

12. The method of claim 9, wherein the forming a barrier layer and the exposing the barrier layer to ions are performed simultaneously.

13. The method of claim 9 wherein
the dummy gate structure is removed prior to forming a barrier layer over the gate dielectric structure and exposing the barrier layer to ions.

14. A method of forming a gate, comprising:
transferring a substrate having a 3D structure comprising a gate dielectric structure disposed over at least two fin structures into a plasma processing apparatus;

exposing the gate dielectric structure to ions with the apparatus, wherein one or more ion bombardment angles are selected in response to an aspect ratio of the fin structures, and wherein the ions create at least one void within the gate dielectric structure, and;

etching the gate dielectric structure after exposing the gate dielectric structure to ions.

15. The method of claim 14, wherein the gate dielectric structure comprises a material selected from the group consisting of boron nitride, silicon nitride, silicon carbon nitride, and silicon dioxide and the at least two fin structures comprise a silicon material.

16. The method of claim 14, wherein the ions exposed to the gate dielectric structure are selected from the group consisting of He+, H3+, H2+, H+, Ne+, F+, $CF_x$+, $CH_x$+, $CH_x$+, B+, BF2+, $B_xH_y$+, Xe+, $C_xH_y$+, molecular carbon, boron and boron carbide.

17. The method of claim 14, wherein a first bombardment angle is between about +10° and about +20° and wherein a second bombardment angle is between about −10° and about −20°.

18. The method of claim 14, wherein the exposing the gate dielectric structure is performed at a temperature less than about 400° C.

19. The method of claim 14 further comprising:

forming a barrier layer over the gate dielectric structure, wherein the barrier layer comprises at least one of boron and carbon.

* * * * *